United States Patent [19]

Sanwo

[11] Patent Number: 5,343,360
[45] Date of Patent: Aug. 30, 1994

[54] CONTAINING AND COOLING APPARATUS FOR AN INTEGRATED CIRCUIT DEVICE HAVING A THERMAL INSULATOR

[75] Inventor: Ikuo J. Sanwo, San Marcos, Calif.

[73] Assignee: NCR Corporation, Dayton, Ohio

[21] Appl. No.: 40,688

[22] Filed: Mar. 31, 1993

[51] Int. Cl.⁵ .............................................. H05K 7/20
[52] U.S. Cl. .................... 361/707; 165/80.4; 174/15.4; 257/707; 257/713; 361/689; 361/699
[58] Field of Search .............. 62/3.3, 513; 165/80.3, 165/80.4, 104.33, 185; 361/688, 689, 699, 690, 701, 702, 704, 707, 709; 257/706, 707, 709, 712, 713, 714, 717; 174/15.4

[56] References Cited

U.S. PATENT DOCUMENTS

| | | |
|---|---|---|
| 2,863,994 | 12/1958 | Kohring . |
| 2,881,370 | 4/1959 | Colson . |
| 4,253,515 | 3/1981 | Swiatosz ............................ 165/61 |
| 4,285,002 | 9/1981 | Campbell . |
| 4,730,665 | 3/1988 | Cutchaw . |
| 4,758,926 | 7/1988 | Herrell et al. . |
| 4,782,664 | 11/1988 | Sterna ................................ 62/3.3 |
| 4,805,420 | 2/1989 | Porter et al. . |
| 4,917,179 | 4/1990 | Giebeler ............................ 165/133 |
| 4,926,242 | 5/1990 | Itoh et al. . |
| 4,935,864 | 6/1990 | Schmidt ............................ 363/141 |
| 4,950,181 | 8/1990 | Porter . |
| 5,012,325 | 4/1991 | Mansoria ............................ 357/81 |
| 5,031,689 | 7/1991 | Jones ................................ 165/1 |
| 5,032,897 | 7/1991 | Mansuria et al. . |
| 5,111,277 | 5/1992 | Medeiros, III et al. . |

*Primary Examiner*—Gerald P. Tolin
*Attorney, Agent, or Firm*—Paul J. Maginot

[57] ABSTRACT

An apparatus for containing and cooling an integrated circuit device includes a container defining a chamber, a first portion of the container includes a first heat sink. The apparatus further includes a second heat sink positioned within the chamber, the integrated circuit device being securable to the second heat sink. Moreover, the apparatus includes a cooling device interposed between the first heat sink and the second heat sink. In addition, the apparatus includes an insulator positioned in the chamber so as to provide thermal isolation between a second portion of the container and the cooling device.

13 Claims, 3 Drawing Sheets

CONTAINING AND COOLING APPARATUS FOR AN INTEGRATED CIRCUIT DEVICE HAVING A THERMAL INSULATOR

CROSS REFERENCE

Cross reference is made to copending U.S. patent application Ser. No. 08/041,066, filed concurrently herewith and entitled "Apparatus for Containing and Cooling an Integrated Circuit Device having a Thermally Insulative Positioning Member," which is assigned to the same assignee as the present invention.

BACKGROUND OF THE INVENTION

The present invention relates to cooling mechanisms and, more particularly, to a containing and cooling apparatus for an integrated circuit device.

It is well known that the performance of some electronic devices can be improved by cooling them to a low temperature, and even to a temperature below 0° C. As a result, a variety of devices have been designed to cool integrated circuit devices. For example, U.S. Pat. No. 5,032,897 discloses a thermoelectrically cooled integrated circuit package which includes an electrically insulative, thermally conductive chip carrier module which defines a cavity. A thermoelectric cooler is positioned within the cavity, and an integrated circuit chip is connected to the thermoelectric cooler. Another example is shown in U.S. Pat. No. 4,730,665 which discloses an apparatus for cooling a high-density integrated circuit device. This apparatus includes a housing in which the circuit device is sealingly mounted in an internal chamber of the housing. The chamber is at least partially filled with a plurality of thermally conductive spheroids which are biased into thermally conductive contact with each other and with the integrated circuit device to maximize the heat exchange surface. This apparatus further includes an inlet and an outlet for passing a dielectric immersion coolant through the chamber in direct heat exchange relationship with the spheroids and with the high-density integrated circuit device. Still another example is shown in U.S. Pat. No. 4,758,926 which describes a device for enclosing, protecting and cooling semiconductor integrated circuit chips. The device includes a generally planar substrate with the chips positioned thereon. Signal connections are provided between at least some of the chips. A heat sink is positioned in contact with the chips and includes microchannels through which a cooling fluid flows for purposes of transferring heat generated by the chips to such fluid. Manifolds are provided to direct the fluid to and from the microchannels, and microcapillary slots may be formed on the heat sink surface adjacent the chips to receive liquid to generate attractive forces between the heat sink and chips to facilitate heat transfer. Circuitry is provided to distribute power through the device and to the chips.

However, a problem which may be encountered with the aforementioned devices is the formation of frost on the surface thereof during low temperature operation. Such problem may result in water developing on the printed circuit board which may cause structural damage thereto or shorting of the electrical circuitry thereon. Also, the aforementioned devices may be relatively difficult and expensive to manufacture.

SUMMARY OF THE INVENTION

In accordance with one embodiment of the present invention, there is provided an apparatus for containing and cooling an integrated circuit device which includes a container defining a chamber, a portion of the container includes a first heat sink. The apparatus further includes a second heat sink positioned within the chamber, the integrated circuit device being securable to the second heat sink. Moreover, the apparatus includes a cooling device interposed between the first heat sink and the second heat sink. Additionally, the apparatus includes an insulator positioned in the chamber so as to provide thermal isolation between a second portion of the container and the cooling device.

Pursuant to another embodiment of the present invention, there is provided an apparatus for containing and cooling an integrated circuit device which includes a container defining a chamber. The apparatus further includes a cooling device positioned within the chamber, the integrated circuit device being positionable within the chamber and locatable relative to the cooling device so as to be cooled thereby. The apparatus additionally includes an insulator positioned within the chamber so as to provide thermal isolation between the cooling device and a part of the container.

It is therefore an object of the present invention to provide a new and useful apparatus for containing and cooling an integrated circuit device.

It is another object of the present invention to provide an improved apparatus for containing and cooling an integrated circuit device.

It is yet another object of the present invention to provide an apparatus for containing and cooling an integrated circuit device which encounters substantially less risk of forming frost on the surface thereof.

It is still another object of the present invention to provide an apparatus for containing and cooling an integrated circuit device which does not cause water to develop on an associated printed circuit board.

It is moreover another object of the present invention to provide an apparatus for containing and cooling an integrated circuit device which does not cause structural damage to an associated printed circuit board or electrical shorting of circuitry on the printed circuit board.

It is yet another object of the present invention to provide an apparatus for containing and cooling an integrated circuit device which is relatively easy and inexpensive to manufacture.

The above and other objects, features, and advantages of the present invention will become apparent from the following description and the attached drawings.

DETAILED DESCRIPTION OF THE PREFERRED EMBODIMENT

Figure 1:
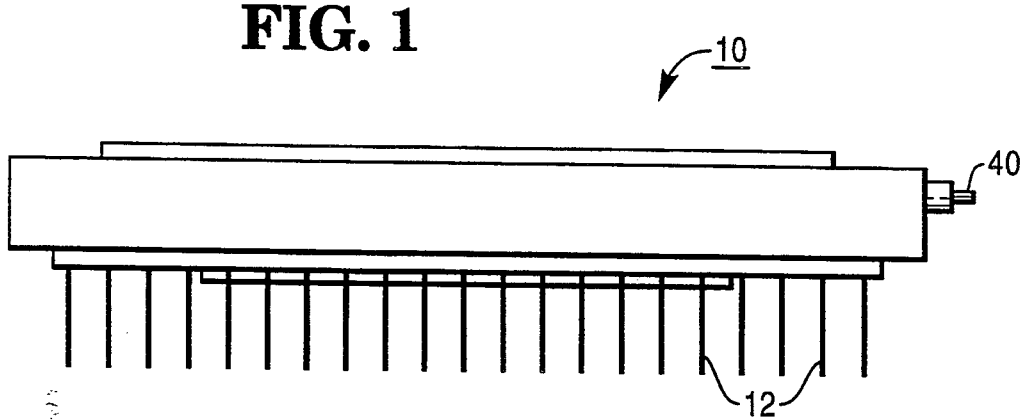
FIG. 1 is a side elevational view of an apparatus for containing and cooling an integrated circuit device incorporating the features of the present invention therein.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the intention is to cover all modifications, equivalents, and alternatives falling within the spirit and scope of the invention as defined by the appended claims.

Figure 2:
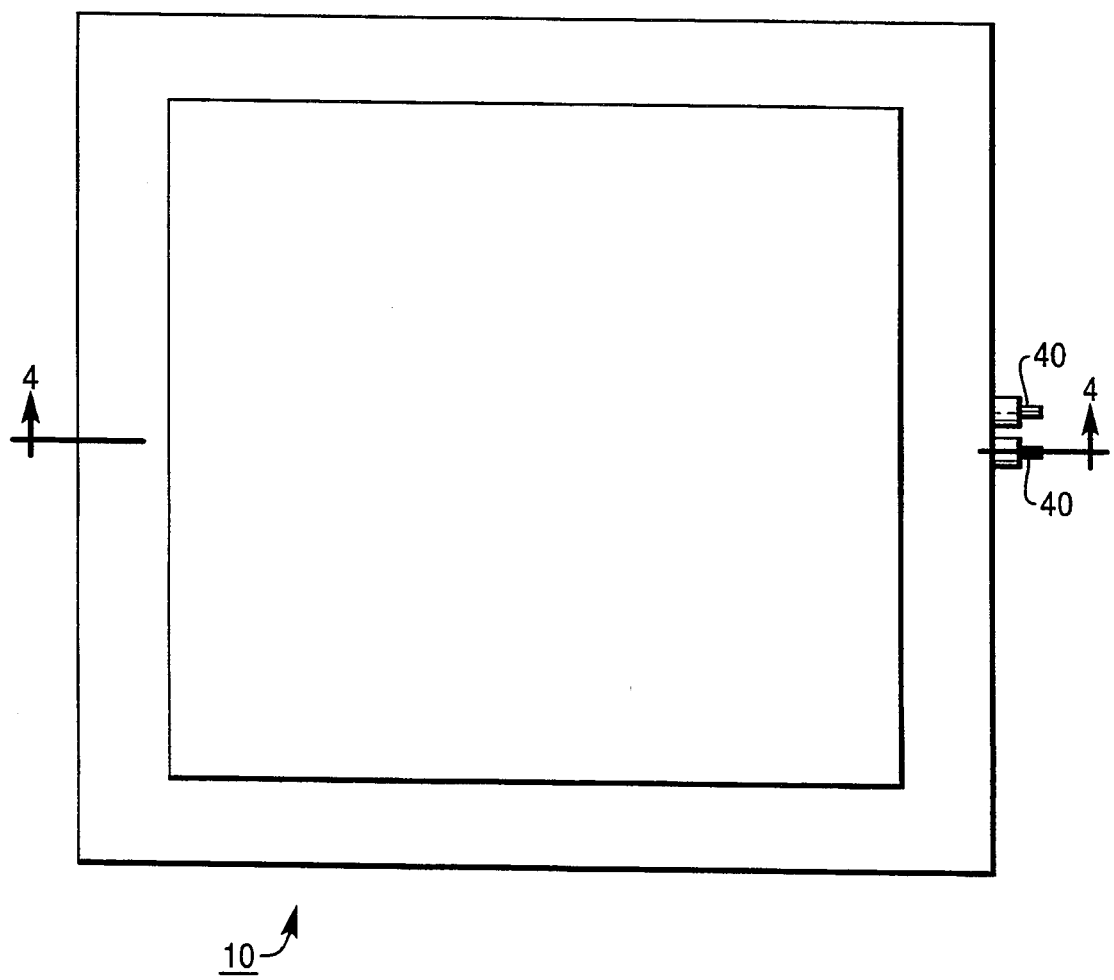
FIG. 2 is a top elevational view of the apparatus for containing and cooling an integrated circuit device of FIG. 1.
Figure 3:
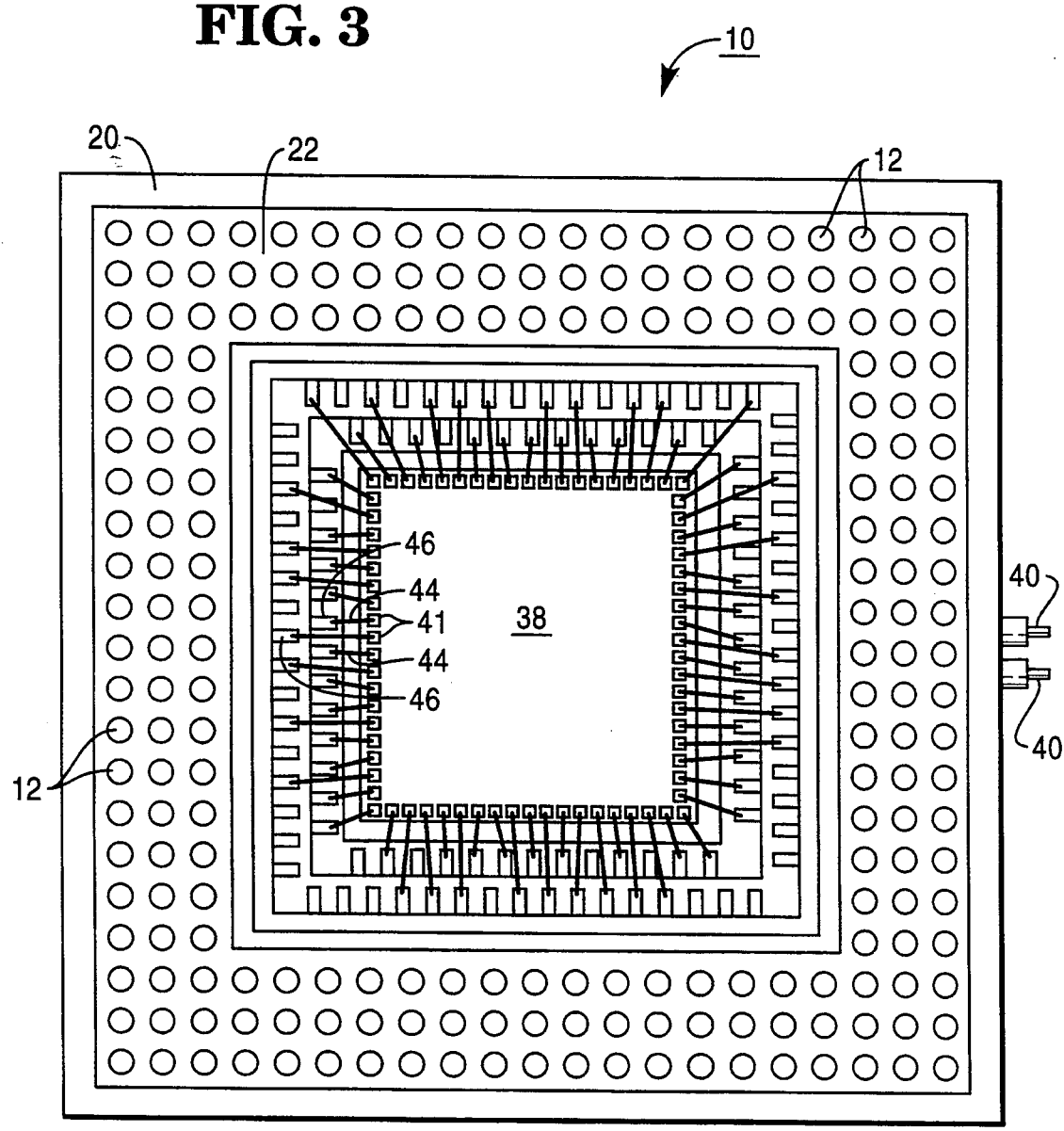
FIG. 3 is a bottom elevational view of the apparatus for containing and cooling an integrated circuit device of FIG. 1 with the cover of the apparatus removed for clarity of description.

Turning now to the drawings, in FIGS. 1-3 there is shown an apparatus for containing and cooling an integrated circuit device, generally indicated by the reference numeral 10. Apparatus 10 is mountable on a printed circuit board (not shown). Apparatus 10 includes a plurality of conductive pins 12 which extend downwardly therefrom. The conductive pins 12 are connectable to various electrical components (not shown) as is well known in the art.

Figure 4:
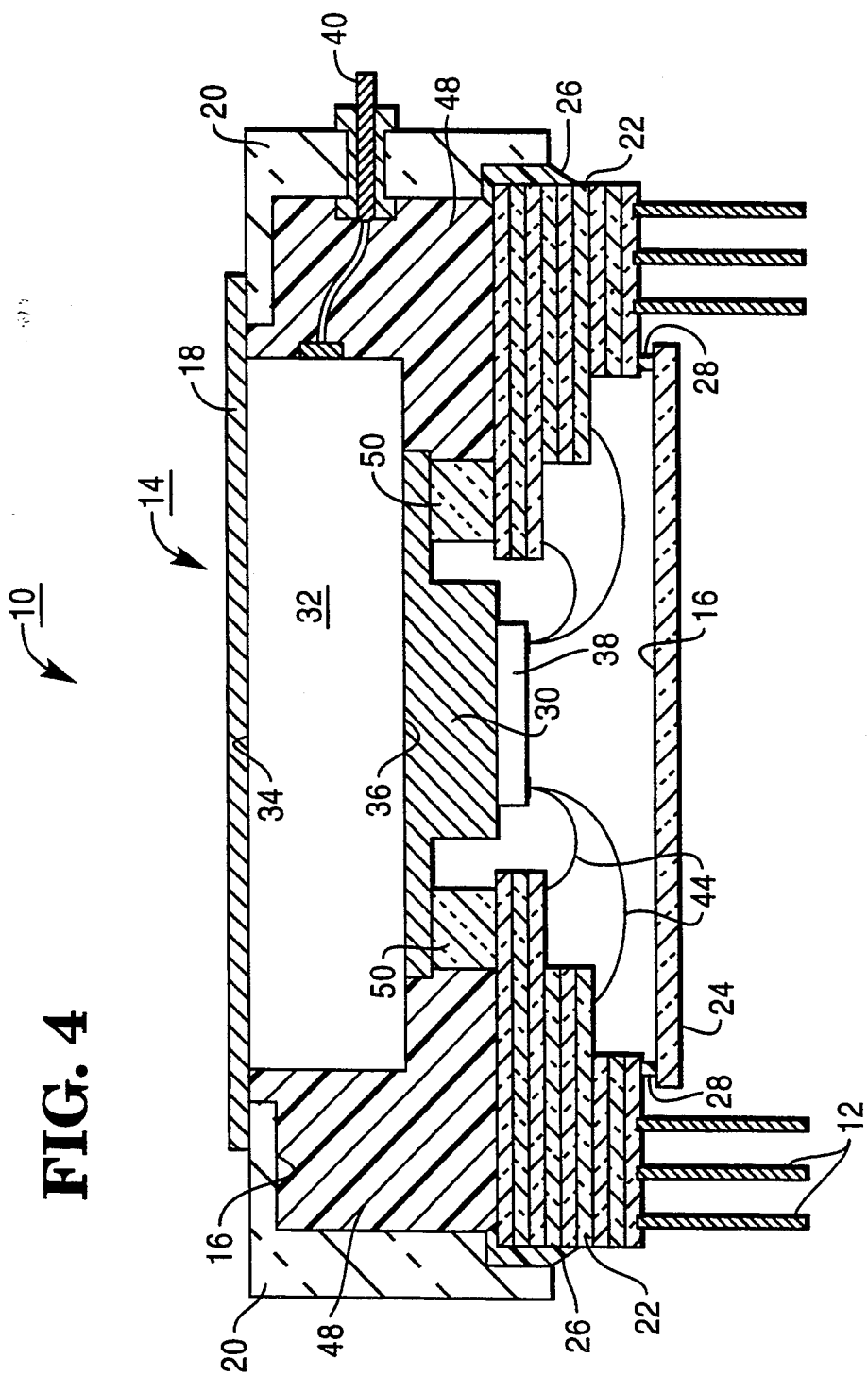
FIG. 4 is an enlarged sectional view taken in the direction of arrows 4—4 of FIG. 2 with the thermoelectric cooler of the apparatus shown in its entirety for clarity of description.

As shown in FIG. 4, the apparatus 10 includes a container 14 which defines a chamber 16. The container 14 includes a heat sink 18, an upper side member 20, a lower side member 22 and a cover 24. The heat sink 18 is made of a copper tungsten material. The upper side member 20, the lower side member 22 and the cover 24 are each made of a ceramic material which is preferably alumina. A hermetic seal 26 is interposed between the upper side member 20 and the lower side member 22. The hermetic seal 26 is a high temperature epoxy material. Another hermetic seal 28 is interposed between the cover 24 and the lower side member 22. The hermetic seal 28 is made of a solder material or a high temperature epoxy material.

Another heat sink 30 is positioned within the chamber 16. The heat sink 30 is made of a copper tungsten material. A cooling device, generally indicated by the reference numeral 32, is also positioned within the chamber 16 and interposed between the heat sink 18 and the heat sink 30. The cooling device 32 is a thermoelectric cooler. One suitable thermoelectric cooler is available from Marlow Industries, Inc. of Dallas, Tex. as model number DT1063. The cooling device 32 has a hot side 34 and a cold side 36. The hot side 34 is positioned in substantial contact with the heat sink 18 while the cold side 36 is positioned in substantial contact with the heat sink 30. The cooling device further includes a pair of terminals 40 which are connectable to a voltage source (not shown). An integrated circuit device 38 is positioned within the chamber 16 and secured to the heat sink 30. The integrated circuit device 38 includes a number of terminals 41 (see FIG. 3) which are electrically connected to the conductive pins 12 via a number of bond wires 44 and a number of electrical traces 46 (partially internal to lower side member 22).

The apparatus 10 further includes an insulating member 48 positioned in the chamber 16 so as to provide thermal isolation between a portion of the container 14 and the cooling device 32. The insulating member 48 is made of a polystyrene foam plastic material. By way of example, the insulating member may be made from Styrofoam, a trademark of Dow Chemical Corporation of Midland, Mich. The insulating member 48 has a high thermoresistance relative to the thermoresistance of ambient room air. A support 50 is interposed between the lower side member 22 and the heat sink 30 as shown in FIG. 4. The support 50 is made of a porcelain material.

During operation of the apparatus 10, a voltage is applied to the terminals 40 of the cooling device 32 so as to cool the cold side 36 thereof. Since the cold side 36 is positioned in contact with the heat sink 30, thermal energy will be transferred by conduction from the heat sink 30 to the cold side of the cooling device. In turn, since the heat sink 30 is positioned in contact with the integrated circuit device 38, thermal energy will be transferred by conduction from the integrated circuit device 38 to the heat sink 30 thereby resulting in substantial cooling of the integrated circuit device 38.

Note that the insulating member 48, the heat sink 18 and the heat sink 30 together combine to substantially enclose the cooling device 32 as shown in FIG. 4. Also note that the insulating member 48 substantially occupies the space defined by the entire area between the upper side member 20 and the cooling device 32 so as to provide thermal isolation between the upper side member 20 and the cooling device 32. The above space, if not occupied by a high thermoresistance insulating member such as Styrofoam, may in effect provide a relatively low thermoresistance path between the cooling device 32 and a non-heat sink portion of the container 14. However, the arrangement shown in FIG. 4 effectively eliminates any such low thermoresistance paths so as to substantially reduce the risk of frost formation on the outer surface of the container 14.

While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected. For example, the invention is herein described as containing and cooling an integrated circuit device which includes only one integrated circuit chip, however, the invention is equally applicable to containing and cooling an integrated circuit device which possesses a plurality of individual integrated circuit chips.

What is claimed is:

1. An integrated circuit package, comprising:
   a first container closed on all sides and defining an enclosed chamber, a first portion of said container including a first heat sink;
   a second heat sink positioned within the enclosed chamber;
   an integrated circuit device positioned within the enclosed chamber and secured to said second heat sink;
   a cooling device interposed between the first heat sink and the second heat sink; and
   an insulator positioned within the enclosed chamber so as to provide thermal isolation between said container and said integrated circuit device.

2. The integrated circuit package of claim 1, wherein said integrated circuit device is spaced apart from said container.

3. The apparatus of claim 1, wherein a space defined by the area interposed between said cooling device and the second portion of said container is substantially occupied by said insulator.

4. The apparatus of claim 1, wherein said cooling device includes a thermoelectric cooler having a hot side and a cold side, the hot side being in substantial contact with said first heat sink and the cold side being in substantial contact with said second heat sink.

5. The apparatus of claim 1, wherein said first heat sink, said second heat sink and said insulator together combine to substantially enclose said cooling device.

6. The apparatus of claim 1, wherein said insulator includes a polystyrene foam plastic material.

7. An integrated circuit package, comprising:
a container closed on all sides and defining an enclosed chamber;
a cooling device positioned within the enclosed chamber;
an integrated circuit device being positioned within the enclosed chamber and located relative to said cooling device so as to be cooled thereby; and
an insulator positioned within the enclosed chamber so as to provide thermal isolation between said integrated circuit device and said container, wherein said integrated circuit device is spaced apart from said container and a first heat sink is disposed in said container in direct contact with said integrated circuit device.

8. The apparatus of claim 7, wherein said cooling device is secured to said container.

9. The apparatus of claim 7, wherein a space defined by the area interposed between said cooling device and said container is substantially occupied by said insulator.

10. The apparatus of claim 7, wherein a second heat sink is defined by part of said container.

11. The apparatus of claim 10, wherein said cooling device includes a thermoelectric cooler having a hot side and a cold side, the hot side being positioned in substantial contact with the first heat sink and the cold side being positioned in substantial contact with the first heat sink.

12. The apparatus of claim 10, wherein said first heat sink, said second heat sink and said insulator together combine to substantially enclose said cooling device.

13. The apparatus of claim 7, wherein said insulator includes a polystyrene foam plastic material.

* * * * *